US010446902B2

(12) United States Patent
Bosshard et al.

(10) Patent No.: US 10,446,902 B2
(45) Date of Patent: Oct. 15, 2019

(54) TRANSMISSION AND EMISSION ASSEMBLY FOR MULTIBEAM ANTENNA AND MULTIBEAM ANTENNA

(71) Applicant: THALES, Courbevoie (FR)

(72) Inventors: Pierre Bosshard, Toulouse (FR); Cyril Jean Benoit Mangenot, Wassenaar (NL); Fréderic Michard, Toulouse (FR)

(73) Assignee: Thales, Courbevoie (FR)

( * ) Notice: Subject to any disclaimer, the term of this patent is extended or adjusted under 35 U.S.C. 154(b) by 0 days.

(21) Appl. No.: 16/006,658

(22) Filed: Jun. 12, 2018

(65) Prior Publication Data

US 2018/0358681 A1 Dec. 13, 2018

(30) Foreign Application Priority Data

Jun. 13, 2017 (FR) ...................... 17 00620

(51) Int. Cl.
*H01Q 1/02* (2006.01)
*H01Q 21/06* (2006.01)
(Continued)

(52) U.S. Cl.
CPC ............... *H01Q 1/02* (2013.01); *H01P 1/122* (2013.01); *H01P 5/12* (2013.01); *H01P 5/16* (2013.01);
(Continued)

(58) Field of Classification Search
CPC ...... H04B 7/18515; H01Q 1/02; H01Q 1/002; H01Q 1/288; H01Q 19/17; H01Q 21/0006;
(Continued)

(56) References Cited

U.S. PATENT DOCUMENTS 5,890,789 A * 4/1999 Inagaki ................. G02F 1/113
359/204.1
7,161,549 B1 1/2007 Cuchanski et al.
(Continued)

OTHER PUBLICATIONS

Braun, Teresa M. *Satellite Communications payload and system.* John Wiley & Sons, 2012, pp. 23-24, 31-32, 111-121.
(Continued)

*Primary Examiner* — Dominic E Rego
(74) *Attorney, Agent, or Firm* — Knobbe, Martens, Olson & Bear, LLP

(57) ABSTRACT

A transmission and emission assembly for a multibeam antenna and a multibeam antenna are disclosed. In one aspect, the assembly includes a plurality of radiating elements forming a radiating surface, an emission distribution network arranged upstream from the radiating surface and including a plurality of emission ports, a receiving distribution network arranged upstream from the radiating surface and including a plurality of receiving ports, a plurality of low-noise amplifiers and a capability for interconnecting each receiving port to at least one low-noise amplifier. The emission distribution network and the receiving distribution network are separate from one another and are arranged in a same unit separate from the communication module. The receiving distribution network and the radiating elements are thermally separated.

13 Claims, 3 Drawing Sheets

(51) Int. Cl.

| | | |
|---|---|---|
| *H03F 3/68* | (2006.01) | |
| *H01P 1/12* | (2006.01) | |
| *H01Q 1/28* | (2006.01) | |
| *H04B 7/185* | (2006.01) | |
| *H01P 5/12* | (2006.01) | |
| *H01P 5/16* | (2006.01) | |
| *H01Q 1/00* | (2006.01) | |
| *H01Q 19/17* | (2006.01) | |
| *H01Q 21/00* | (2006.01) | |
| *H01Q 23/00* | (2006.01) | |
| *H01Q 25/00* | (2006.01) | |
| *H03F 1/52* | (2006.01) | |
| *H03F 3/60* | (2006.01) | |

(52) U.S. Cl.
CPC ............ *H01Q 1/002* (2013.01); *H01Q 1/288* (2013.01); *H01Q 19/17* (2013.01); *H01Q 21/0006* (2013.01); *H01Q 21/064* (2013.01); *H01Q 23/00* (2013.01); *H01Q 25/007* (2013.01); *H03F 1/526* (2013.01); *H03F 3/602* (2013.01); *H03F 3/68* (2013.01); *H04B 7/18515* (2013.01)

(58) Field of Classification Search
CPC .... H01Q 21/064; H01Q 23/00; H01Q 25/007; H01P 1/122; H01P 5/12; H01P 5/16; H03F 1/526; H03F 3/602; H03F 3/68
See application file for complete search history.

(56) References Cited

U.S. PATENT DOCUMENTS

| | | | | |
|---|---|---|---|---|
| 7,511,664 | B1* | 3/2009 | Mason | H01Q 1/02 |
| | | | | 342/372 |
| 2002/0033134 | A1* | 3/2002 | Fannon | F26B 3/28 |
| | | | | 118/667 |
| 2003/0108283 | A1* | 6/2003 | Ota | G02B 6/12021 |
| | | | | 385/24 |
| 2004/0150554 | A1* | 8/2004 | Stenger | H01P 1/047 |
| | | | | 342/175 |
| 2005/0052333 | A1 | 3/2005 | Rao et al. | |
| 2006/0265034 | A1* | 11/2006 | Aknine | A61N 1/40 |
| | | | | 607/101 |
| 2009/0325628 | A1* | 12/2009 | Becker | A62C 35/60 |
| | | | | 455/523 |
| 2010/0032008 | A1* | 2/2010 | Adekore | B82Y 20/00 |
| | | | | 136/255 |
| 2012/0038503 | A1* | 2/2012 | Kodama | G01S 7/032 |
| | | | | 342/70 |
| 2013/0312903 | A1* | 11/2013 | Yu | G02F 1/1303 |
| | | | | 156/275.5 |
| 2014/0194293 | A1 | 7/2014 | Kumamoto et al. | |
| 2015/0185425 | A1* | 7/2015 | Gundel | G02B 6/4292 |
| | | | | 455/90.2 |
| 2016/0079680 | A1* | 3/2016 | Stottrup | H01Q 3/08 |
| | | | | 343/835 |
| 2017/0281963 | A1* | 10/2017 | Shen | A61N 1/40 |
| 2018/0029085 | A1* | 2/2018 | Justice | B07C 5/34 |

OTHER PUBLICATIONS

Search Report dated Feb. 16, 2018 received in FR 1700620.
Search Report received in EP18177476.1, European counterpart to this application, dated Oct. 25, 2018.

* cited by examiner

TRANSMISSION AND EMISSION ASSEMBLY FOR MULTIBEAM ANTENNA AND MULTIBEAM ANTENNA

CROSS-REFERENCE TO RELATED APPLICATIONS

This patent application claims the benefit under 35 U.S.C. § 119 of French Application No. FR 17 00620 filed on Jun. 13, 2017 which is hereby incorporated by reference in its entirety.

BACKGROUND

Technological Field

The described technology relates to a transmission and emission assembly for a multibeam antenna.

The described technology also relates to a multibeam antenna including such an assembly.

Description of the Related Technology

In a manner known in itself, the term "multibeam antenna" generally refers to an antenna including several radiating elements. Each of these elements is able to receive and/or emit a beam of electromagnetic waves having an elementary signal that is part of a more complex signal received by the antenna or intended to be emitted by the latter.

Some multibeam antennas, in particular those used in the satellite telecommunications field, use a large number of radiating elements, which makes it possible to increase the technical performance of these antennas.

In general, in this type of multibeam antennas, the radiating elements are arranged across from a reflector located outside the satellite and are connected to the other components of the antenna by waveguides having rigid structures.

Furthermore, these other components are typically placed in the inner part of the satellite, i.e., in its payload. This in particular aims to thermally insulate the radiating elements, which generally have a so-called hot zone of the antenna, from the other components, which must remain in a so-called cold zone, in order to minimize the performance losses of the antenna.

Among the aforementioned components, one can in particular distinguish a distribution network for emitting waveguides making it possible to form a plurality of elementary signals to be emitted toward the radiating elements and a distribution network for receiving waveguides making it possible to process elementary signals received by the radiating elements.

The distribution network for receiving waveguides generally includes a plurality of amplifiers then making it possible to amplify the elementary signals received by the radiating elements.

SUMMARY OF CERTAIN INVENTIVE ASPECTS

One can then see that with the increase in the number of radiating elements, the architecture of such a multibeam antenna is complicated considerably.

Indeed, when this number increases, it is necessary to increase the number of waveguides, which is reflected by an increase in the routing complexity from the waveguides to the corresponding distribution networks, and more generally an increase in costs of the antenna. This complexity may also downgrade the performance of the multibeam antenna.

Thus, one inventive aspect includes an assembly for a multibeam antenna making it possible to reduce the use of waveguides even when the number of radiating elements becomes large, without downgrading the performance of the antenna.

To that end, the described technology relates to a transmission and emission assembly for a multibeam antenna further including a communication module.

The assembly comprises a plurality of radiating elements forming a radiating surface, each radiating element being capable of emitting and receiving electromagnetic signals downstream from the radiating surface; an emission distribution network arranged upstream from the radiating surface and including a plurality of emission ports, each emission port being connected to a radiating element by an emission waveguide and able to emit, via the corresponding radiating element, an electromagnetic signal formed from an electromagnetic signal coming from the communication module; a receiving distribution network arranged upstream from the radiating surface and including a plurality of receiving ports, a plurality of low-noise amplifiers and a capability for interconnecting each receiving port to at least one low-noise amplifier, each receiving port being connected to a radiating element by a receiving waveguide and able to receive each electromagnetic signal coming from the corresponding radiating element and to send it to the associated low-noise amplifier to obtain an amplified electromagnetic signal intended for the communication module.

The emission distribution network and the receiving distribution network are separate from one another and are arranged in a same unit separate from the communication module; additionally, the receiving distribution network and the radiating elements are thermally separated.

According to other advantageous aspects of the described technology, the assembly comprises one or more of the following features, considered alone or according to all technically possible combinations:

the receiving distribution network is connected to the communication module by coaxial cables;

the radiating elements assume the form of horns, at least one of the horns being elongate along a horn axis;

the receiving distribution network assumes the form of a plate arranged transversely relative to the horn axis and having a first surface oriented toward the radiating elements and a second surface opposite the first surface, the receiving ports being arranged on the first surface in predetermined positions;

the emission distribution network is arranged between the radiating elements and the receiving distribution network along the horn axis;

the interconnection capability includes a plurality of electromechanical switches controllable to switch the interconnection of each receiving port between at least two different low-noise amplifiers;

the interconnection capability forms a redundancy loop;

the redundancy loop and the number of low-noise amplifiers are suitable for providing N:N+P redundancy, where N means the total number of receiving ports connected to the radiating elements and P means the number of failures of the low-noise amplifiers necessary for a receiving port to become unusable;

the receiving distribution network further includes a thermal control system;

the thermal control system includes a plurality of stacked channels for a fluid arranged on the first and/or second surfaces;

the receiving waveguides are made from a thermally insulating material capable of thermally insulating the low-noise amplifiers from the radiating elements; and the assembly includes a plurality of radio frequency channels, each radio frequency channel being associated with a radiating element and connecting this radiating element to the corresponding receiving waveguide and/or to the corresponding transmission waveguide.

The described technology also relates to a multibeam antenna including a communication module and an emission and reception assembly as previously described.

According to other advantageous aspects of the described technology, the antenna comprises the following feature:

it is placed on a space vehicle, the unit comprising the emission distribution network and the receiving distribution network is arranged outside the space vehicle and the communication module is arranged in the payload of the space vehicle.

BRIEF DESCRIPTION OF THE DRAWINGS

These features and advantages of the described technology will appear upon reading the following description, provided solely as a non-limiting example, and done in reference to the appended drawings, in which.

DETAILED DESCRIPTION OF CERTAIN INVENTIVE ASPECTS

Figure 1:
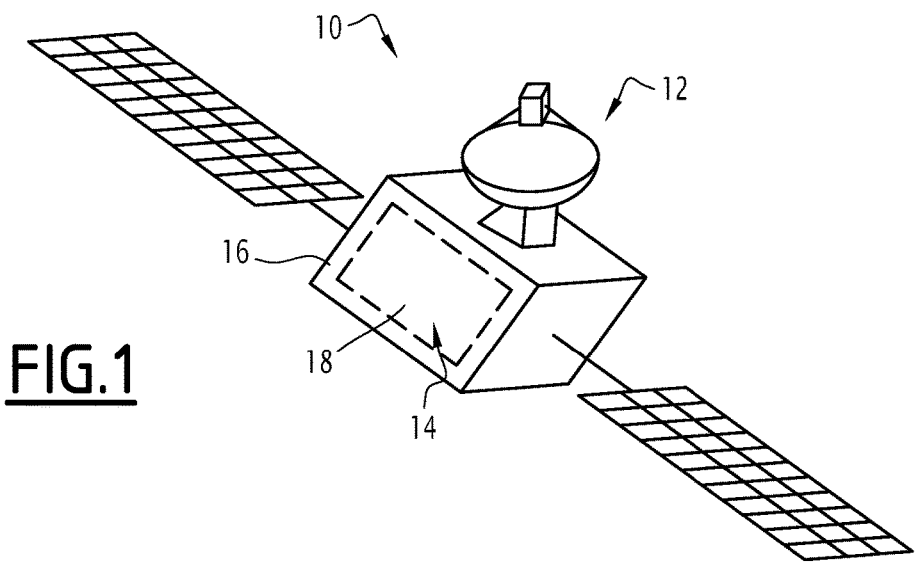
FIG. 1 is a schematic view of a satellite including a multibeam antenna according to the described technology.

The satellite 10 of FIG. 1 is for example a telecommunications satellite arranged on a land-based orbit and able to communicate with one or several land-based centers by emitting and receiving electromagnetic signals via the multibeam antenna 12.

The satellite 10 has an inner part 14 delimited by a satellite body 16. The inner part 14 in particular includes a payload 18.

In a manner known in itself, the payload 18 includes equipment performing the mission of the satellite 12 and is protected, in particular thermally, from the outside space by the body 16.

In the rest of the description, "outside of the satellite" generally refers to the space outside the satellite body 16.

The antenna 12 is arranged partially outside the satellite 10 and partially in its inner part 14, as will be explained hereinafter.

Figure 2:
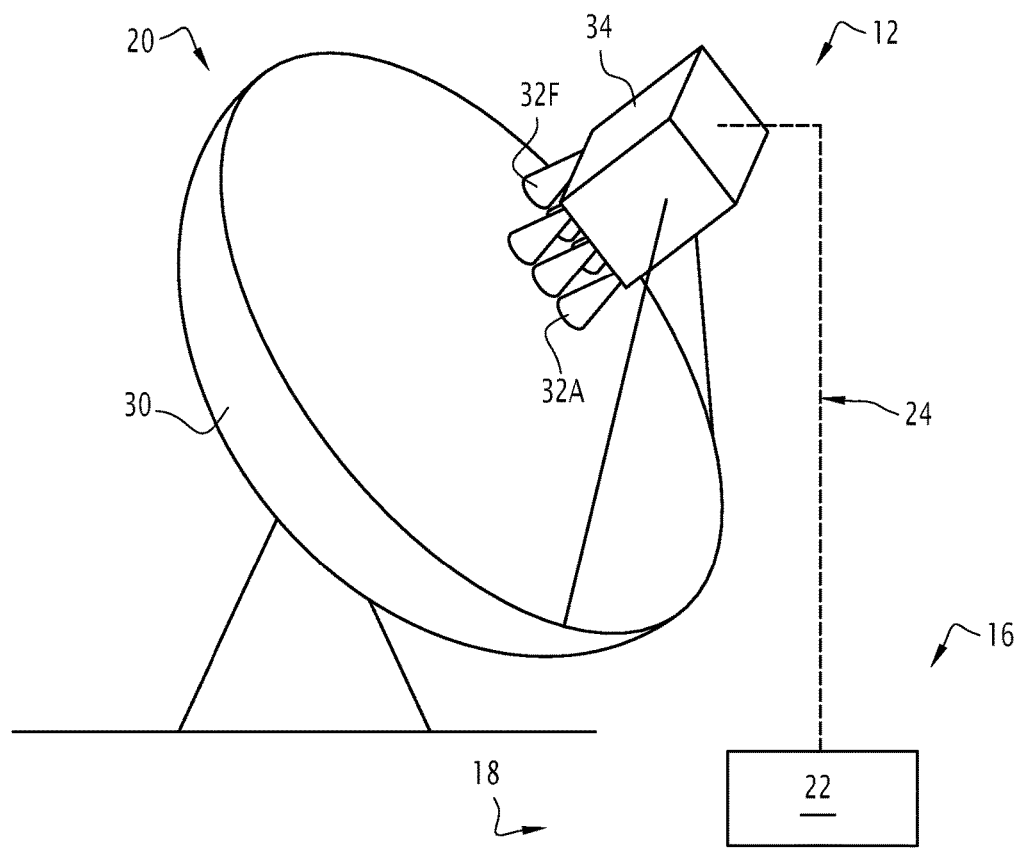
FIG. 2 is a schematic view of the multibeam antenna of FIG. 1, the multibeam antenna including a unit in particular comprising an emission distribution network and a reception distribution network.

In reference to FIG. 2, the antenna 12 includes an assembly 20 for emitting and receiving electromagnetic signals, a communication module 22 and a capability for connecting 24 the communication module 22 to the assembly 20.

In the described example, the connecting capability 24 assumes the form of coaxial cables.

The communication module 22 is arranged in the payload 18 of the satellite 12. This module 22 assumes the form of an electronic component for example connected to an on board computer of the satellite 10.

In particular, the communication module 22 is able to generate an emission signal for example from digital data transmitted to this module 22 by the on board computer and to transmit this emission signal to the assembly 20 via the connecting capability 24.

The communication module 22 is further able to receive electromagnetic signals received by the assembly 20, convert them into digital data and send these digital data to the on board computer.

The assembly 20 is arranged outside the satellite 10, i.e., outside the satellite body 16, and comprises a reflector 30, a plurality of radiating elements 32A to 32N arranged across from the reflector 30 and a unit 34 connected on the one hand to the radiating elements 32A to 32N and on the other hand to the communication module 22 via the connecting capability 24.

The reflector 30 is known in itself. Thus, for example, it has a parabolic shape oriented toward the Earth's surface.

The radiating elements 32A to 32F are for example arranged substantially in the focus of the reflector 30. In this position, they are maintained by suitable support capability known in itself.

Each radiating element 32A to 32F assumes the form of a horn for emitting and/or receiving electromagnetic signals. Each horn has an elongate shape and has a wide end and a narrow end. At least one of the horns, for example the horn corresponding to the radiating element 32C, is elongated along an axis, called horn axis X.

The horns have an identical shape or different shapes.

All of the horns are arranged on a planar surface of the unit 34 oriented toward the reflector 30 and are for example fastened on this surface by their narrow ends. The wide ends of the horns therefore protrude relative to this surface and form a radiating surface S visible in FIG. 3.

This radiating surface S is for example substantially planar and is perpendicular to the horn axis X. In this case, all of the horns are elongated along the horn axis X.

In the example described below, there are six horns, and therefore radiating elements 32A to 32F.

The content of the unit 34 will be outlined below in reference to FIG. 3.

Figure 3:
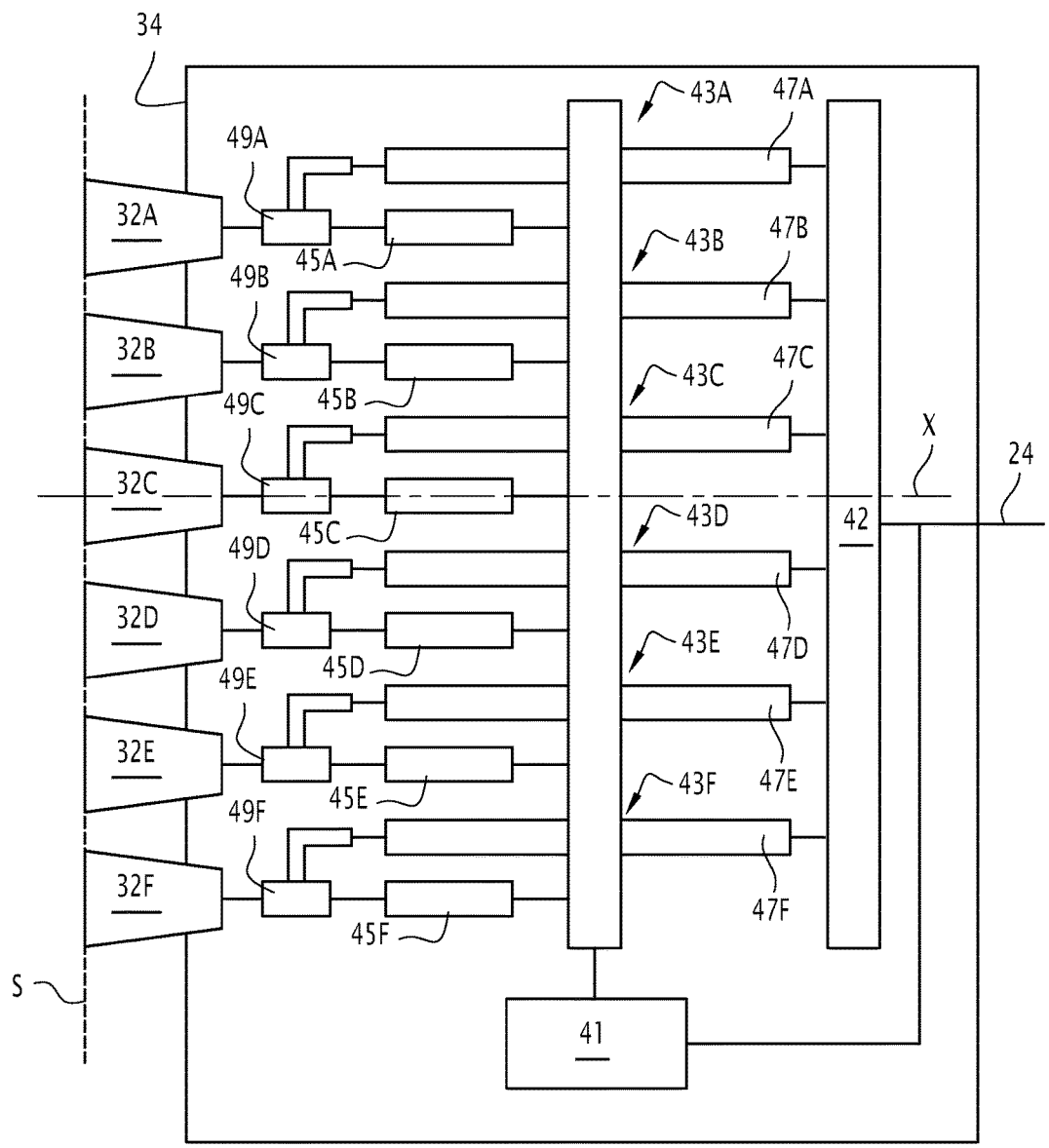
FIG. 3 is a detailed schematic view of the unit of FIG. 2.

It should be noted that in FIG. 3, this content is illustrated in the form of a diagram, i.e., without showing the actual physical shapes and positions of different elements.

In particular, in reference to FIG. 3, the unit 34 comprises an emission distribution network 41, a reception distribution network 42 and, for each radiating element 32A to 32F, a transmission channel 43A to 43F connecting the corresponding radiating element 32A to 32F to the emission distribution network 41 and/or the reception distribution network 42.

In the example embodiment of FIG. 3, the transmission channels 43A to 43F connect each radiating element 32A to 32F to the emission distribution network 41 and the reception distribution network 42.

To that end, each transmission channel 43A to 43F comprises an emission waveguide 45A to 45F connecting the corresponding radiating element 32A to 32F to the emission distribution network 41, and a reception waveguide 47A to 47F connecting the corresponding radiating element 32A to 32F to the reception distribution network 42.

Furthermore, each transmission channel 43A to 43F further comprises a radio frequency channel 49A to 49F connecting the reception 47A to 47F and emission 45A to 45F waveguides corresponding to the same radiating element 32A to 32F, to that radiating element 32A to 32F.

The emission distribution network 41 includes a plurality of emission ports connected to the radiating elements 32A to 32F via the corresponding emission waveguides 45A to 45F.

The emission distribution network 41 is further connected to the communication module 22 via the connecting capability 24 and able to receive each electromagnetic signal coming from this communication module 22 in order to emit it via the radiating elements 32A to 32F in the form of elementary signals.

The emission distribution network 41 thus has an electronic component arranged between the radiating surface S and the reception distribution network 42.

In other words, the emission distribution network 41 is arranged closer to the radiating surface S than the reception distribution network 42.

Furthermore, the emission waveguides 45A to 45F have a length shorter than that of the reception waveguides 47A to 47F.

Like the emission distribution network 41, the reception distribution network 42 includes a plurality of reception ports connected to the radiating elements 32A to 32F via the corresponding reception waveguides 47A to 47F.

The reception distribution network 42 is also connected to the communication module 22 via the connecting capability 24 and capable of receiving elementary signals coming from the corresponding radiating elements 32A to 32F, and amplifying them and transmitting them to the communication module 22 via the connecting capability 24.

Figure 4:
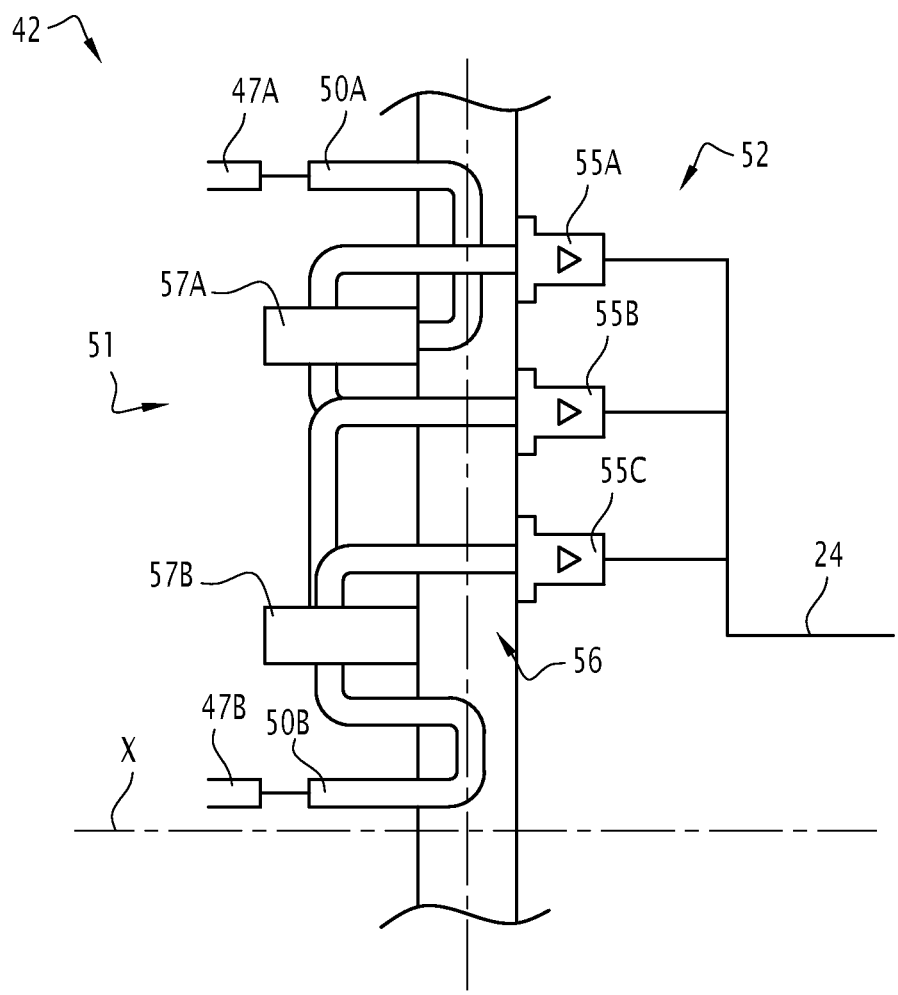
FIG. 4 is a detailed schematic view of the reception distribution network of the unit of FIG. 3.

The reception distribution network 42 will now be explained in more detail in reference to FIG. 4, illustrating a sectional view of part of this reception distribution network 42.

Indeed, in this FIG. 4, only two reception ports 50A and 50B respectively connected to the reception waveguides 47A and 47B are visible.

Furthermore, as also visible in FIG. 4, the receiving distribution network 42 assumes the form of a plate arranged transversely relative to the horn axis X and having a first surface 51 oriented toward the radiating elements 32A to 32F and a second surface 52 opposite the first surface 51. The reception ports 50A and 50B are arranged on the first surface 51, for example in predetermined positions.

The plate is for example made from stacked layers.

The reception distribution network 42 further includes a plurality of low-noise amplifiers 55A to 55C arranged on the second surface 52 and an interconnection capability 56 arranged through the plate and connecting each reception port 50A, 50B to at least one low-noise amplifier 55A to 55C. In FIG. 4, only three amplifiers 55A to 55C are visible.

Each low-noise amplifier 55A to 55C is known in itself and for example has an amplifier of the Low Noise Amplifier (LNA) type.

The interconnection capability 56 includes waveguides and a plurality of electromechanical switches 57A, 57B integrated into the waveguides. Each switch 57A, 57B is controllable to switch the interconnection of the corresponding reception port 50A, 50B between at least two different low-noise amplifiers 55A to 55C. In FIG. 4, only two switches 57A and 57B are visible.

The control of the switches 57A, 57B is for example done by specific signals transmitted by the communication module 22 via the connecting capability 24.

According to one particularly advantageous embodiment, the interconnection capability 56 forms a redundancy loop making it possible to replace at least some of the faulty amplifiers 55A to 55C with redundant amplifiers 55A to 55C.

In particular, the redundancy loop and particularly the arrangement of the corresponding waveguides through the plate and the number of switches 57A, 57B, as well as the number of low-noise amplifiers 55A to 55C, are suitable for providing N:N+P redundancy, where N means the total number of receiving ports connected to radiating elements 32A to 32F and P means the number of failures of the low-noise amplifiers necessary for a receiving port to become unusable.

In particular, in the example embodiment of FIG. 3, the number N is equal to six and the number P is equal to three. In this case, the total number of low-noise amplifiers is equal to nine.

Lastly, the reception distribution network 42 further includes a thermal control system (not illustrated) for example including a plurality of stacked channels for a fluid arranged on the first and/or second surfaces 51 and 52, or inside the plate.

This thermal control system makes it possible to generate a zone near the reception distribution network 42 in which the temperature is controlled. This zone is called cold zone, as opposed to a so-called hot zone near the radiating elements 32A to 32F.

Furthermore, according to one example embodiment, the waveguides, and in particular the reception waveguides 47A to 47F, are made from a thermally insulating material. This then makes it possible to further insulate the reception distribution network 42 of the radiating elements 32A to 32F.

More generally, according to one example embodiment, the unit 34 includes an independent thermal control system coupling a network of heat pipes to a radiator. This system is for example coupled to a thermal control system of the satellite 12.

One can see that the described technology has a certain number of advantages.

First, the arrangement of the reception distribution network, and in particular the low-noise amplifiers, as close as possible to the radiating elements makes it possible to considerably reduce the use of the waveguides. This then makes it possible to convey electromagnetic signals to the communication module via simple coaxial cables, which are more flexible, less cumbersome and less costly than the waveguides typically used in these cases.

Furthermore, thermal control done in the vicinity of the reception distribution network makes it possible to arrange this network as close as possible to the radiating elements without deteriorating the performance of the antenna.

Furthermore, the separation of the emission and reception distribution networks makes it possible to configure the redundancy loop of the reception distribution network in the desired manner. In particular, in the described example, the N:N+P redundancy has been obtained.

Of course, the described technology is not limited to the embodiment previously described.

In particular, the described technology remains applicable to any type of multibeam antenna, and not only multibeam antennas on board a satellite. Thus, it is possible to carry out the described technology in multibeam antennas on board any other type of moving vehicle or arranged to be stationary, for example on the earth's surface.

While there have been shown and described and pointed out the fundamental novel features of the invention as applied to certain inventive embodiments, it will be understood that the foregoing is considered as illustrative only of the principles of the invention and not intended to be exhaustive or to limit the invention to the precise forms disclosed. Modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplate. All such modifications and variations are within the scope of the invention as determined by the appended claims when interpreted in accordance with the breadth to which they are entitled.

What is claimed is:

1. A transmission and emission assembly for a multibeam antenna further including a communication module, the assembly comprising:
    a plurality of radiating elements forming a radiating surface, each of the radiating elements being capable of emitting and receiving electromagnetic signals downstream from the radiating surface;
    an emission distribution network arranged upstream from the radiating surface and including a plurality of emission ports, each of the emission ports being connected to a radiating element by an emission waveguide and configured to emit, via the corresponding radiating element, an electromagnetic signal formed from an electromagnetic signal coming from the communication module; and
    a receiving distribution network arranged upstream from the radiating surface and including a plurality of receiving ports, a plurality of low-noise amplifiers and a capability for interconnecting each receiving port to at least one low-noise amplifier, each of the receiving ports being connected to a radiating element by a receiving waveguide and configured to receive each electromagnetic signal coming from the corresponding radiating element and to send it to the associated low-noise amplifier to obtain an amplified electromagnetic signal intended for the communication module,
    wherein:
    the emission distribution network and the receiving distribution network are separate from one another and are arranged in a same unit separate from the communication module, and
    the receiving distribution network and the radiating elements are thermally separated.

2. The assembly according to claim 1, wherein the receiving distribution network is connected to the communication module by coaxial cables.

3. The assembly according to claim 1, wherein the radiating elements have the form of horns, at least one of the horns being elongate along a horn axis.

4. The assembly according to claim 3, wherein the receiving distribution network has the form of a plate arranged transversely relative to the horn axis and having a first surface oriented toward the radiating elements and a second surface opposite the first surface, the receiving ports being arranged on the first surface in predetermined positions.

5. The assembly according to claim 3, wherein the emission distribution network is arranged between the radiating elements and the receiving distribution network along the horn axis.

6. The assembly according to claim 1, wherein the interconnection capability includes a plurality of electromechanical switches controllable to switch the interconnection of each receiving port between at least two different low-noise amplifiers.

7. The assembly according to claim 6, wherein:
    the interconnection capability forms a redundancy loop, and
    the redundancy loop and the number of low-noise amplifiers are suitable for providing N:N+P redundancy, where N means the total number of receiving ports connected to the radiating elements and P means the number of failures of the low-noise amplifiers necessary for a receiving port to become unusable.

8. The assembly according to claim 1, wherein the receiving distribution network further includes a thermal control system.

9. The assembly according to claim 8, wherein:
    the receiving distribution network has the form of a plate arranged transversely relative to the horn axis and having a first surface oriented toward the radiating elements and a second surface opposite the first surface, the receiving ports being arranged on the first surface in predetermined positions, and
    the thermal control system includes a plurality of stacked channels for a fluid arranged on the first and/or second surfaces.

10. The assembly according to claim 1, wherein the receiving waveguides are made from a thermally insulating material capable of thermally insulating the low-noise amplifiers from the radiating elements.

11. The assembly according to claim 1, further including a plurality of radio frequency channels, each radio frequency channel being associated with a radiating element and connecting this radiating element to the corresponding receiving waveguide and/or to the corresponding transmission waveguide.

12. A multibeam antenna including a communication module and an emission and reception assembly according to claim 1.

13. The antenna according to claim 12, wherein, when the antenna is placed on a space vehicle, the unit comprising the emission distribution network and the receiving distribution network is arranged outside the space vehicle and the communication module is arranged in the payload of the space vehicle.

* * * * *